(12) United States Patent
Wang et al.

(10) Patent No.: US 11,295,643 B2
(45) Date of Patent: Apr. 5, 2022

(54) DETECTION METHOD AND DETECTION DEVICE FOR DISPLAY SUBSTRATE

(71) Applicants: Hefei Xinsheng Optoelectronics Technology Co., Ltd., Anhui (CN); BOE Technology Group Co., Ltd., Beijing (CN)

(72) Inventors: Jun Wang, Beijing (CN); Dongfang Wang, Beijing (CN); Guangyao Li, Beijing (CN); Haitao Wang, Beijing (CN); Qinghe Wang, Beijing (CN); Tongshang Su, Beijing (CN); Chen Shen, Beijing (CN); Xiaoning Zhang, Beijing (CN); Youpeng Gan, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 1 day.

(21) Appl. No.: 17/032,901

(22) Filed: Sep. 25, 2020

(65) Prior Publication Data

US 2021/0097910 A1    Apr. 1, 2021

(30) Foreign Application Priority Data

Sep. 27, 2019    (CN) .......................... 201910931871.8

(51) Int. Cl.
*G06F 3/038*    (2013.01)
*G09G 3/00*    (2006.01)
(Continued)

(52) U.S. Cl.
CPC ............. *G09G 3/006* (2013.01); *G01R 31/54* (2020.01); *G09G 3/3225* (2013.01);
(Continued)

(58) Field of Classification Search
USPC .......................... 345/77, 211, 212, 214, 690
See application file for complete search history.

(56) References Cited

U.S. PATENT DOCUMENTS

2008/0055211 A1*  3/2008  Ogawa ................. G09G 3/3225
                                                              345/77
2009/0295785 A1* 12/2009  Yamamoto ........... G09G 3/3233
                                                              345/214

(Continued)

*Primary Examiner* — Thuy N Pardo
(74) *Attorney, Agent, or Firm* — Nath, Goldberg & Meyer; Joshua B. Goldberg

(57) ABSTRACT

Provided are a detection method and a detection device, the detection method includes: in a first writing stage, providing an active voltage to each data line, each power supply terminal, both ends of a first gate line to-be-detected, an absolute value of the active voltage of each data line is smaller than that of the active voltage of the power supply terminal, an absolute value of the active voltage of the first gate line to-be-detected is smaller than that of the active voltage of each data line; in a first detection stage, maintaining the active voltage of the power supply terminal, providing an inactive voltage to the first gate line to-be-detected and providing an active voltage to the data line, detecting voltages at second electrodes of storage capacitors corresponding to the first gate line to-be-detected, determining whether the first gate line to-be-detected has breakpoint according to the detected voltages.

20 Claims, 3 Drawing Sheets in the first writing stage, providing an active voltage to each data line, providing an active voltage to each power supply terminal, and providing an active voltage to both ends of a first gate line to be detected, wherein an absolute value of the active voltage provided to each data line is smaller than that of the active voltage provided to the power supply terminal, and an absolute value of the active voltage provided to the both ends of the first gate line to be detected is smaller than that of the active voltage provided to each data line   P3 in the first detection stage, maintaining the active voltage provided to the power supply terminal unchanged, providing an inactive voltage to both ends of the first gate line to be detected and providing an active voltage to each data line, detecting voltages on second electrodes of storage capacitors corresponding to the first gate line to be detected, and determining whether the first gate line to be detected has defect of breakpoint according to the detected voltages   P4

(51) Int. Cl.
  *G01R 31/54*   (2020.01)
  *G09G 3/3225*  (2016.01)
  *H01L 51/00*   (2006.01)
  *H01L 51/56*   (2006.01)

(52) U.S. Cl.
  CPC .......... *H01L 51/0031* (2013.01); *H01L 51/56* (2013.01); *G09G 2300/0426* (2013.01); *G09G 2330/02* (2013.01)

(56) References Cited

U.S. PATENT DOCUMENTS

| | | | |
|---|---|---|---|
| 2011/0187762 A1* | 8/2011 | Osame | G09G 3/3258 345/690 |
| 2012/0162182 A1* | 6/2012 | Lin | G09G 3/3648 345/212 |
| 2017/0040400 A1* | 2/2017 | Eguchi | H01L 27/12 |
| 2017/0084750 A1* | 3/2017 | Yamazaki | H01L 29/7869 |
| 2017/0133511 A1* | 5/2017 | Arasawa | H01L 29/78696 |
| 2017/0287421 A1* | 10/2017 | Chu | G02F 1/134309 |
| 2018/0004321 A1* | 1/2018 | Kuroiwa | G06F 3/04166 |
| 2018/0337288 A1* | 11/2018 | Shin | G09G 3/3233 |
| 2019/0108777 A1* | 4/2019 | Yuan | G09G 3/3291 |
| 2019/0295465 A1* | 9/2019 | Kimura | G09G 3/3291 |
| 2019/0340976 A1* | 11/2019 | Kimura | G09G 3/3225 |
| 2020/0312221 A1* | 10/2020 | Chen | H01L 27/156 |
| 2020/0350391 A1* | 11/2020 | Kimura | H01L 29/78669 |
| 2021/0055587 A1* | 2/2021 | Kimura | G02F 1/136213 |

\* cited by examiner

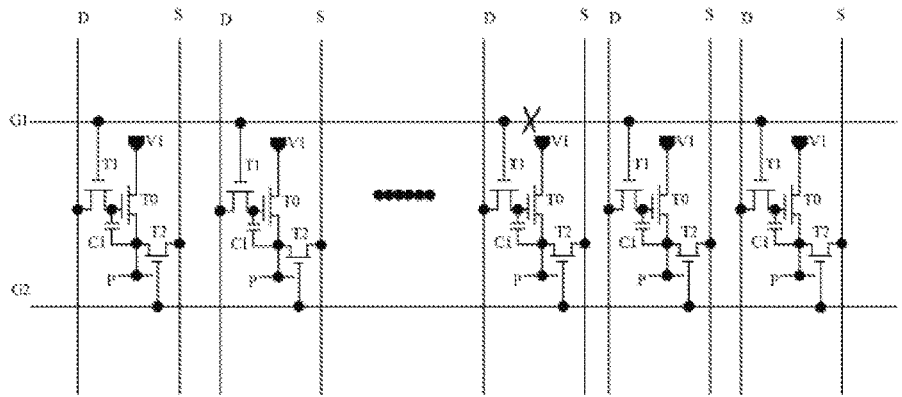

Fig. 1 in the first writing stage, providing an active voltage to each data line, providing an active voltage to each power supply terminal, and providing an active voltage to both ends of a first gate line to be detected, wherein an absolute value of the active voltage provided to each data line is smaller than that of the active voltage provided to the power supply terminal, and an absolute value of the active voltage provided to the both ends of the first gate line to be detected is smaller than that of the active voltage provided to each data line    P3 in the first detection stage, maintaining the active voltage provided to the power supply terminal unchanged, providing an inactive voltage to both ends of the first gate line to be detected and providing an active voltage to each data line, detecting voltages on second electrodes of storage capacitors corresponding to the first gate line to be detected, and determining whether the first gate line to be detected has defect of breakpoint according to the detected voltages    P4

Fig. 2

DETECTION METHOD AND DETECTION DEVICE FOR DISPLAY SUBSTRATE

CROSS REFERENCE TO RELATED APPLICATIONS

The present application claims priority to Chinese patent application No. 201910931871.8 filed at the Chinese intellectual property office on Sep. 27, 2019, the disclosure of which is incorporated herein by reference in its entirety.

TECHNICAL FIELD

The present disclosure relates to the field of display technology, and in particular, to a detection method and a detection device for a display substrate.

BACKGROUND

Organic Light Emitting Diode (OLED) display devices have been gradually commercialized. For an organic light emitting diode display device with a relative large size, since each gate line is relative long, driving voltages need to be applied to both ends of the gate line at the same time in a driving process, so that the voltages at various positions of the gate line cannot have a large difference therebetween.

SUMMARY

The present disclosure provides a detection method and a detection device for a display substrate, which are used for detecting defect of breakpoint of a gate line in an Array stage.

According to a first aspect of the present disclosure, there is provided a detection method for a display substrate, the display substrate includes a plurality of pixel circuits arranged along a first direction and a second direction which intersect with each other, a plurality of first gate lines extending along the first direction, and a plurality of data lines extending along the second direction, a same row of pixel circuits arranged along the first direction correspond to one of the first gate lines, a same column of pixel circuits arranged along the second direction correspond to one of the data lines, each of the pixel circuits includes a switching transistor, a driving transistor and a storage capacitor, wherein a gate of the switching transistor is coupled with the first gate line corresponding thereto, a first electrode of the switching transistor is coupled with the data line corresponding thereto, a second electrode of the switching transistor is coupled with a first electrode of the storage capacitor and a gate of the driving transistor, a first electrode of the driving transistor is coupled with a power supply terminal, and a second electrode of the driving transistor is coupled with a second electrode of the storage capacitor; wherein the detection method includes a first writing stage and a first detection stage, and wherein, in the first writing stage, providing an active voltage to each of the data lines, providing an active voltage to each power supply terminal, and providing an active voltage to both ends of the first gate line to be detected, wherein an absolute value of the active voltage provided to each of the data lines is smaller than that of the active voltage provided to the power supply terminal, and an absolute value of the active voltage provided to the both ends of the first gate line to be detected is smaller than that of the active voltage provided to each of the data lines;

in the first detection stage, maintaining the active voltage provided to the power supply terminal unchanged, providing an inactive voltage to both ends of the first gate line to be detected and providing an active voltage to each of the data lines, detecting voltages at second electrodes of storage capacitors corresponding to the first gate line to be detected, and determining whether the first gate line to be detected has defect of breakpoint according to the detected voltages;

when an absolute value of the voltage at the second electrode of each storage capacitor corresponding to the first gate line to be detected is larger than a first preset threshold, determining that the first gate line to be detected has no defect of breakpoint; otherwise, determining that the first gate line to be detected has defect of breakpoint.

In some implementation, the display substrate further includes a plurality of second gate lines extending along the first direction, and a plurality of sensing lines extending along the second direction, a same row of pixel circuits arranged along the first direction correspond to one of the second gate lines, a same column of pixel circuits arranged along the second direction correspond to one of the sensing lines, each of the pixel circuits further includes a sensing transistor, a gate of the sensing transistor is coupled with the second gate line corresponding thereto, a first electrode of the sensing transistor is coupled with the sensing line corresponding thereto, and a second electrode of the sensing transistor is coupled with the second electrode of the storage capacitor corresponding thereto;

in the first writing stage and the first detection stage, an inactive voltage is provided to both ends of the second gate line corresponding to the first gate line to be detected, and an active voltage is provided to each of the sensing lines.

In some implementation, the detection method further includes a first reset stage before the first writing stage, where in the first reset stage, providing an inactive voltage to each of the data lines, providing an inactive voltage to each of the sensing lines, providing an inactive voltage to each power supply terminal, providing an active voltage to both ends of the first gate line to be detected, and providing an active voltage to both ends of the second gate line corresponding to the first gate line to be detected.

In some implementation, the detection method further includes a first preparation stage before the first writing stage and after the first reset stage, where, in the first preparation stage, providing an active voltage to each of the data lines, providing an active voltage to each power supply terminal, providing an active voltage to each of the sensing lines, providing an inactive voltage to both ends of the first gate line to be detected, and providing an inactive voltage to both ends of the second gate line corresponding to the first gate line to be detected, wherein an absolute value of the active voltage provided to each of the data lines is smaller than an absolute value of the active voltage provided to each power supply terminal.

In some implementation, the detection method further includes a second reset stage, a second writing stage and a second detection stage, where in the second reset stage, providing an active voltage to both ends of the second gate line to be detected, providing an active voltage to both ends of the first gate line corresponding to the second gate line to be detected, providing an inactive voltage to each of the data lines, and providing an inactive voltage to each of the sensing lines; in the second writing stage, providing an active voltage to both ends of the second gate line to be detected, providing an inactive voltage to both ends of the first gate line corresponding to the second gate line to be detected, providing an active voltage to each of the sensing lines, providing an active voltage to each of the data lines, and providing an active voltage to each power supply terminal, wherein an absolute value of the active voltage provided to each of the sensing lines is greater than an absolute value of the active voltage provided to the both ends of the second gate line to be detected; in the second detection stage, providing an inactive voltage to both ends of the second gate line to be detected, providing an inactive voltage to both ends of the first gate line corresponding to the second gate line to be detected, providing an inactive voltage to each of the sensing lines, detecting voltages at second electrodes of storage capacitors corresponding to the second gate line to be detected, and determining whether the second gate line to be detected has defect of breakpoint according to the detected voltages; in response to that absolute values of the voltages at the second electrodes of the storage capacitors corresponding to the second gate line to be detected are all larger than a second preset threshold value, determining that the second gate line to be detected has no defect of breakpoint; otherwise, determining that the second gate line to be detected has defect of breakpoint.

In some implementation, the detection method further includes a second preparation stage before the second writing stage and after the second reset stage, where in the second preparation stage, providing an inactive voltage to both ends of the second gate line to be detected, providing an inactive voltage to both ends of the first gate line corresponding to the second gate line to be detected, providing an inactive voltage to each of the sensing lines firstly, then providing an active voltage to each of the sensing lines and maintaining the active voltage provided to each of the sensing lines, and meanwhile, maintaining active voltages provided to each of the data lines and each power supply terminal.

According to a second aspect of the present disclosure, there is provided a detection device for a display substrate, the display substrate includes a plurality of pixel circuits arranged along a first direction and a second direction which intersect with each other, a plurality of first gate lines extending along the first direction, and a plurality of data lines extending along the second direction, where a same row of pixel circuits arranged along the first direction correspond to one of the first gate lines, a same column of pixel circuits arranged along the second direction correspond to one of the data lines, each of the pixel circuits includes a switching transistor, a driving transistor and a storage capacitor, a gate of the switching transistor is coupled with the first gate line corresponding thereto, a first electrode of the switching transistor is coupled with the data line corresponding thereto, a second electrode of the switching transistor is coupled with a first electrode of the storage capacitor and a gate of the driving transistor, a first electrode of the driving transistor is coupled with a power supply terminal, and a second electrode of the driving transistor is coupled with a second electrode of the storage capacitor; where the detection device includes a driving circuit, a detection circuit and a determination circuit, the driving circuit is configured to: in a first writing stage, provide an active voltage to each of the data lines, provide an active voltage to the power supply terminal, and provide an active voltage to both ends of the first gate line to be detected, wherein an absolute value of the active voltage provided to each of the data lines is smaller than that of the active voltage provided to the power supply terminal, and an absolute value of the active voltage provided to both ends of the first gate line to be detected is smaller than that of the active voltage provided to each of the data lines; in a first detection stage, maintain the active voltage provided to the power supply terminal unchanged, provide an inactive voltage to both ends of the first gate line to be detected and provide an active voltage to each of the data lines;

the detection circuit is configured to: detect voltages at second electrodes of storage capacitors corresponding to the first gate line to be detected in the first detection stage;

the determination circuit is configured to: determine whether the first gate line to be detected has defect of breakpoint or not according to the voltages detected by the detection circuit;

in response to that absolute values of the voltages at the second electrodes of the storage capacitors corresponding to the first gate line to be detected are all larger than a first preset threshold, the determination circuit determines that the first gate line to be detected has no defect of breakpoint; otherwise, the determination circuit determines that the first gate line to be detected has defect of breakpoint.

In some implementations, the display substrate further includes a plurality of second gate lines extending along the first direction, and a plurality of sensing lines extending along the second direction, where a same row of pixel circuits arranged along the first direction correspond to one of the second gate lines, a same column of pixel circuits arranged along the second direction correspond to one of the sensing lines, the pixel circuit further includes a sensing transistor, a gate of the sensing transistor is coupled to the second gate line corresponding thereto, a first electrode of the sensing transistor is coupled to the sensing line corresponding thereto, and a second electrode of the sensing transistor is coupled to the second electrode of the storage capacitor in the pixel circuit where the sensing transistor is located;

the driving circuit is further configured to: in the first writing stage and the first detection stage, provide an inactive voltage to both ends of the second gate line corresponding to the first gate line to be detected, and provide an active voltage to each of the sensing lines.

In some implementations, the driving circuit is further configured to: in a first reset stage before the first writing stage, provide an inactive voltage to each of the data lines, provide an inactive voltage to each of the sensing lines, provide an inactive voltage to each power supply terminal, provide an active voltage to both ends of the first gate line to be detected, and provide an active voltage to both ends of the second gate line corresponding to the first gate line to be detected.

In some implementations, the driving circuit is further configured to: in a first preparation stage before the first writing stage and after the first reset stage, provide an active voltage to each of the data lines, provide an active voltage to each power supply terminal, provide an active voltage to each of the sensing lines, provide an inactive voltage to both ends of the first gate line to be detected, and provide an inactive voltage to both ends of the second gate line corresponding to the first gate line to be detected, where an absolute value of the active voltage provided to each of the data lines is smaller than an absolute value of the active voltage provided to the power supply terminal.

In some implementations, the driving circuit is further configured to: in a second reset stage, provide an active voltage to both ends of the second gate line to be detected, provide an active voltage to both ends of the first gate line corresponding to the second gate line to be detected, provide an inactive voltage to each of the data lines, and provide an inactive voltage to each of the sensing lines; in a second writing stage, provide an active voltage to both ends of the second gate line to be detected, provide an inactive voltage to both ends of the first gate line corresponding to the second gate line to be detected, provide an active voltage to each of the sensing lines, provide an active voltage to each of the data lines, and provide an active voltage to each power supply terminal, wherein an absolute value of the active voltage provided to each of the sensing lines is greater than an absolute value of the active voltage provided to the both ends of the second gate line to be detected; in a second detection stage, provide an inactive voltage to both ends of the second gate line to be detected, provide an inactive voltage to both ends of the first gate line corresponding to the second gate line to be detected, provide an inactive voltage to each of the sensing lines, and simultaneously maintain inactive voltages provided to each of the data lines and the power supply line;

the detection circuit is further configured to: detect voltages at the second electrodes of storage capacitors corresponding to the second gate line to be detected in the second detection stage;

the determination circuit is further configured to determine whether the second gate line to be detected has defect of breakpoint according to the voltages detected by the detection circuit;

in response to that absolute values of the voltages at the second electrodes of the storage capacitors corresponding to the second gate line to be detected are all larger than a second preset threshold value, the determination circuit determinates that the second gate line to be detected has no defect of breakpoint; otherwise, the determination circuit determines that the second gate line to be detected has defect of breakpoint.

In some implementations, the driving circuit is further configured to: in a second preparation stage before the second writing stage and after the second reset stage, provide an inactive voltage to both ends of the second gate line to be detected, provide an inactive voltage to both ends of the first gate line corresponding to the second gate line to be detected, provide an inactive voltage to each of the sensing lines first and then provide an active voltage to each of the sensing lines, while maintaining active voltages provided to each of the data lines and the power supply line.

In some implementations, the detection device further includes a display circuit, where the display circuit is configured to display, in a first color, the second electrode of the storage capacitor, at which an absolute value of the voltage is greater than or equal to the first preset threshold value, among the second electrodes of the storage capacitors corresponding to the first gate line to be detected, and to display, in a second color, the second electrode of the storage capacitor, at which an absolute value of the voltage is smaller than the first preset threshold value, among the second electrodes of the storage capacitors corresponding to the first gate line to be detected, and the first color is different from the second color.

In some implementations, the detection device further includes a display circuit configured to display, in a third color, the second electrode of the storage capacitor, at which an absolute value of the voltage is larger than the second preset threshold value, among the second electrodes of the storage capacitors corresponding to the second gate line to be detected, and display, in a fourth color, the second electrode of the storage capacitor, at which an absolute value of the voltage is smaller than the second preset threshold value, among the second electrodes of the storage capacitors corresponding to the second gate line to be detected, wherein the third color is different from the fourth color.

DESCRIPTION OF DRAWINGS

FIG. 1 is a schematic diagram of circuit structure of a display substrate according to an embodiment of the present disclosure;

FIG. 2 is a flow chart of a detection method for a display substrate according to an embodiment of the present disclosure;

Figure 3:
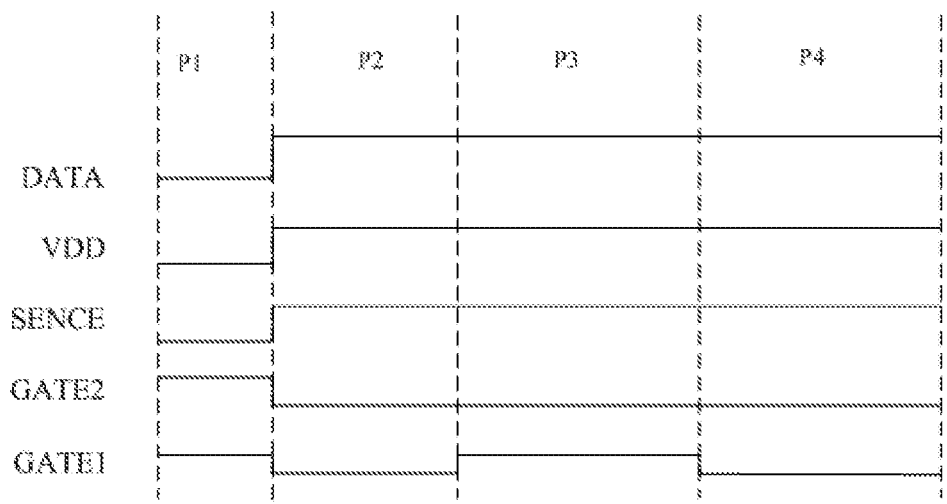
FIG. 3 is a timing diagram of a detection method for a display substrate according to an embodiment of the present disclosure.

Reference signs: G1, first gate line; G2, second gate line; D, data line; S, sensing line; T1, switching transistor; T0, driving transistor; T2, sensing transistor; C1, storage capacitor; P, pixel electrode; V1, power supply terminal; 1. driving circuit; 2. detection circuit; 3. determination circuit; 4. display circuit.

DESCRIPTION OF EMBODIMENTS

In order to make the technical solutions of the present disclosure better understood, the present disclosure is further described in detail with reference to the accompanying drawings and the detailed description below.

In the related art, in a first stage of fabricating an OLED display substrate, a pixel array (generally including various transistors, gate lines, data lines, pixel electrodes, etc.) is formed on a base (such as glass or polyimide). This stage is referred to as an array substrate stage or Array stage in the art. In a second stage of fabricating the OLED display substrate subsequent to the first stage, an organic light emitting layer, a common cathode layer, a thin film encapsulation layer, etc. are formed on the pixel electrode, thereby completing the manufacturing of the organic light emitting diode display substrate.

In the related art, in a case where a gate line needs to be driven at two ends thereof, for example, if the gate line has a breakpoint, due to a voltage drop (IR drop) of the gate line itself, when the gate line is driven to drive a pixel circuit coupled to the gate line, gate voltages received by consecutive pixel circuits near the breakpoint are insufficient, which may cause that, during actual displaying, consecutive sub-pixels display dark (or black), that is, a line defect occurs. How to effectively detect defect of breakpoint of the gate line in the Array stage becomes a technical problem to be solved urgently.

An embodiment of the present disclosure provides a detection method for a display substrate.

Referring to FIG. 1, the display substrate has a plurality of pixel circuits arranged in a first direction and a second direction which intersect with each other, a plurality of first gate lines G1 extending along the first direction, and a plurality of data lines D extending along the second direction (where the first direction is, for example, a row direction at a current viewing angle of FIG. 1, and the second direction is, for example, a column direction at the current viewing angle of FIG. 1, but the first direction and the second direction may be interchanged), a same row of pixel circuits arranged along the first direction correspond to one first gate line G1, and a same column of pixel circuits arranged along the second direction correspond to one data line D. FIG. 1 shows only one row of pixel circuits.

The pixel circuit includes a switching transistor T1, a driving transistor T0 and a storage capacitor C1, where a gate of the switching transistor T1 is coupled with the first gate line G1 corresponding thereto, a first electrode of the switching transistor T1 is coupled with the data line D corresponding thereto, a second electrode of the switching transistor T1 is coupled with a first electrode of the storage capacitor C1 and a gate of the driving transistor T0, a first electrode of the driving transistor T0 is coupled with a power supply terminal V1, and a second electrode of the driving transistor T0 is coupled with a second electrode of the storage capacitor C1. The second electrode of the storage capacitor is further typically coupled to the pixel electrode P. In some implementations, the second electrode of the storage capacitor and the pixel electrode P are coupled together, and in other implementations, the second electrode of the storage capacitor and the pixel electrode P are structures in different layers, but they are electrically coupled together. The display substrate is still in the Array stage, and no organic light-emitting layer is formed on the pixel electrode P. The following detection method is described by taking detecting the voltage at the pixel electrode P as an example, and is equivalent to detecting the voltage at the second electrode of the storage capacitor C1 or the voltage at the second electrode of the driving transistor T0.

The detection method can be used for detecting whether any first gate line G1 has a defect of breakpoint. The symbol "X" in FIG. 1 identifies that a defect of breakpoint occurs at a position of the first gate line G1, i.e., the first gate line G1 is electrically disconnected at this position. For example, a signal provided to both ends of the first gate line G1 to be detected is marked as GATE1, a signal provided to the data line D is marked as DATA, a signal provided to the power supply terminal V1 is marked as VDD, a signal provided to the sensing line S (mentioned later) is marked as SENSE, and a signal provided to the second gate line G2 (mentioned later) is marked as GATE2. With reference to FIG. 2, the detection method includes the following stages P3 and P4.

In the following description, taking both the switching transistor T1 and the driving transistor T0 in the pixel circuit being NMOS transistors as an example. An active voltage provided to both ends of the first gate line G1 to be detected is a high level voltage for turning on the corresponding switching transistor T1. An inactive voltage provided to both ends of the first gate line G1 to be detected is a low level voltage (e.g., a ground voltage) for turning off the corresponding switching transistor T1. The active voltage provided to each data line D is a high level voltage, and the voltage at the data line D is subsequently written into the first electrode of the storage capacitor C1 (coupled to the gate of the driving transistor T0) to control a degree of the driving transistor T0 being turned on. The inactive voltage provided to each data line D is a low level voltage (e.g., a ground voltage). an active voltage received by each power supply terminal V1 is also a high level voltage. An inactive voltage received by each power supply terminal V1 is a low level voltage (e.g., a ground voltage).

In the first writing stage P3, an active voltage is provided to each data line D, an active voltage is provided to the power supply terminal V1, and an active voltage is provided to both ends of the first gate line G1 to be detected, where an absolute value of the active voltage provided to the data line D is smaller than that of the active voltage provided to the power supply terminal V1 and an absolute value of the active voltage provided to both ends of the first gate line G1 to be detected is smaller than that of the active voltage provided to the data line D.

In a case where the first gate line G1 to be detected has no defect of breakpoint, a voltage at the gate of each of switching transistors T1 (i.e., the active voltage provided to both ends of the first gate line G1 to be detected) corresponding thereto is less than a voltage at a drain of the switching transistor T1 (i.e., the active voltage provided to each data line D), and the switching transistors T1 operate in a saturation region, thereby being sufficiently turned on. A voltage of the gate (approximately being the active voltage provided to each data line D) of each of driving transistors T0 corresponding to the first gate line G1 to be detected is less than a voltage of a drain (i.e., the active voltage provided to the power supply terminal V1 corresponding thereto) of the driving transistor T0, the driving transistors T0 operate in the saturation region, and the driving transistors T0 are sufficiently turned on. At this time, a relationship of voltages satisfies: $V_{GATE1}<V_{DATA}<VDD$. At this time, voltage at both electrodes of each of storage capacitors corresponding to the first gate line G1 to be detected each are a high level voltage, but have slightly different amplitudes. At this time, a high level voltage is present at each of pixel electrodes P corresponding to the first gate line G1 to be detected.

In response to that the first gate line G1 to be detected has a defect of breakpoint, for example, the first gate line G1 is electrically disconnected at a position indicated by the symbol "X" in FIG. 1, voltages received, from the first gate line G1 to be detected, by several consecutive pixel circuits near the breakpoint are relatively small. The switching transistors T1 in the consecutive pixel circuits near the breakpoint are always turned off or in a linear region, and the driving transistors T0 in the consecutive pixel circuits near the breakpoint are also always turned off or in the linear region, so that the voltages at the consecutive pixel electrodes P near the breakpoint are always inactive voltages. For example, in response to that the voltages at the both ends of the first gate line G1 to be detected each are 6V (for example, in a normal condition), the voltages received by the consecutive pixel circuits (i.e., the voltage of the gats of the switching transistors T1) near the breakpoint from the first gate line G1 to be detected are respectively 3V, 2V, 1V, 0V, 1V, 2V, and 3V in sequence. Obviously, the switching transistors T1 in these seven pixel circuits cannot be turned on, the voltages at the data lines D corresponding thereto cannot be written into the gates of the driving transistors T0, the driving transistors T0 are remained to be turned off, and the pixel electrodes P in these seven pixel circuits are kept at low level voltages respectively.

In the first detection stage P4, the active voltage provided to each power supply terminal V1 corresponding to the first gate line G1 to be detected is maintained unchanged, the inactive voltage is provided to both ends of the first gate line G1 to be detected, voltages at the pixel electrodes P corresponding to the first gate line G1 to be detected are detected, when the absolute values of the voltages at the pixel electrodes P corresponding to the first gate line G1 to be detected are all greater than a first preset threshold value, it is determined that the first gate line G1 to be detected has no defect of breakpoint, and otherwise, it is determined that the first gate line G1 to be detected has defect of breakpoint.

Since the first gate line G1 to be detected has an inactive voltage, the switching transistors T1 corresponding to the first gate line G1 to be detected are all turned off, and the driving transistors T0 corresponding to the first gate line G1 to be detected are kept to be turned on (if they were previously turned on), although a few ones of the consecutive driving transistors T0 near the breakpoint (if there is defect of breakpoint) still are kept to be turned off or in a slightly turned-on state. If the first gate line G1 to be detected has no breakpoint, the voltage at each corresponding pixel electrode P is kept to be the active voltage, for example, above 6V at this stage. If the first gate line G1 to be detected has defect of breakpoint, at this stage, voltages at several consecutive pixel electrodes P near the breakpoint are all inactive voltages, for example, 3V, 2V, 1V, 0V, 1V, 2V, and 3V in sequence. A person skilled in the art can set a suitable first preset threshold for determining whether the voltage at the pixel electrode P is the active voltage at this time, which is not limited in the present embodiment. According to the above-mentioned driving sequence, if a case where the absolute value of the voltage at the pixel electrode P is relative low occurs, the absolute values of the voltages at several consecutive pixel electrodes P are inevitably low, so that a dot defect is represented in a line defect manner, which is convenient for observation.

The above detection method is applicable to pixel circuits, no matter whether there is the sensing transistor T2, that is, the detection method is applicable to the pixel circuit structure of 2T1C or the pixel circuit structure of 3T1C. Further optimization and variation of the detection method is described below with a pixel circuit structure of 3T1C.

That is, as shown in FIG. 1, the display substrate further has a plurality of second gate lines G2 extending along the first direction and a plurality of sensing lines S extending along the second direction, each second gate line G2 corresponds to a same row of pixel circuits arranged along the first direction, each sensing line S corresponds to a same column of pixel circuits arranged along the second direction, the pixel circuit further has a sensing transistor T2, a gate of the sensing transistor T2 is coupled to the second gate line G2 corresponding thereto, a first electrode of the sensing transistor T2 is coupled to the sensing line S corresponding thereto, and a second electrode of the sensing transistor T2 is coupled to the pixel electrode P corresponding thereto.

For the detection method, in the first writing stage P3 and the first detection stage P4, an inactive voltage is provided to both ends of the second gate line G2 corresponding to the first gate line G1 to be detected. Thus, each sensing transistor T2 corresponding to the first gate line G1 to be detected is always turned off, and changes of signals at the second gate line G2 and the sensing line S cannot interfere with the detection for breakpoint of the first gate line G1.

As shown in FIG. 3, taking the sensing transistors T2 being NMOS transistors as an example, a low level voltage (e.g., a ground voltage) is provided to both ends of the second gate line G2 corresponding to the first gate line G1 to be detected in both the first writing stage P3 and the first detection stage P4.

In some implementations, the active voltage is provided to each of the sensing lines S in both the first writing stage P3 and the first detection stage P4. Following the previous example, referring to FIG. 3, a high level voltage is provided to each of the sensing lines S in both the first writing stage P3 and the first detection stage P4. Weak coupling capacitance exists between each sensing line S and the pixel electrode P in the pixel circuit coupled with the sensing line S. Since the signal at each sensing line S is a high level signal, the voltage at the pixel electrode P can be raised, thereby facilitating the detection. Certainly, in these two stages, the sensing line S may be applied with the inactive voltage or set to be floating.

In some implementations, a first reset stage P1 is further included before the first writing stage P3, and in the first reset stage P1, an inactive voltage is provided to each of the data lines D, an inactive voltage is provided to each of the sensing lines S, an inactive voltage is provided to each power supply terminal V1, an active voltage is provided to both ends of the first gate line G1 to be detected, and an active voltage is provided to both ends of the second gate line G2 corresponding to the first gate line G1 to be detected.

In this manner, the voltages at both electrodes of each storage capacitor C1 may be reset, e.g., both set to ground.

In some implementations, a first preparation stage P2 is further included before the first writing stage P3 and after the first reset stage P1, where an active voltage is provided to each of the data lines D, an active voltage is provided to each power supply terminal V1, an active voltage is provided to each of the sensing lines S, and an inactive voltage is provided to both ends of the first gate line G1 to be detected, where an absolute value of the active voltage provided to the data line D is smaller than an absolute value of the active voltage provided to the power supply terminal V1.

In this way, drains of switching transistors T1 and driving transistors T0 corresponding to the first gate line G1 to be detected are pre-charged.

Figure 4:
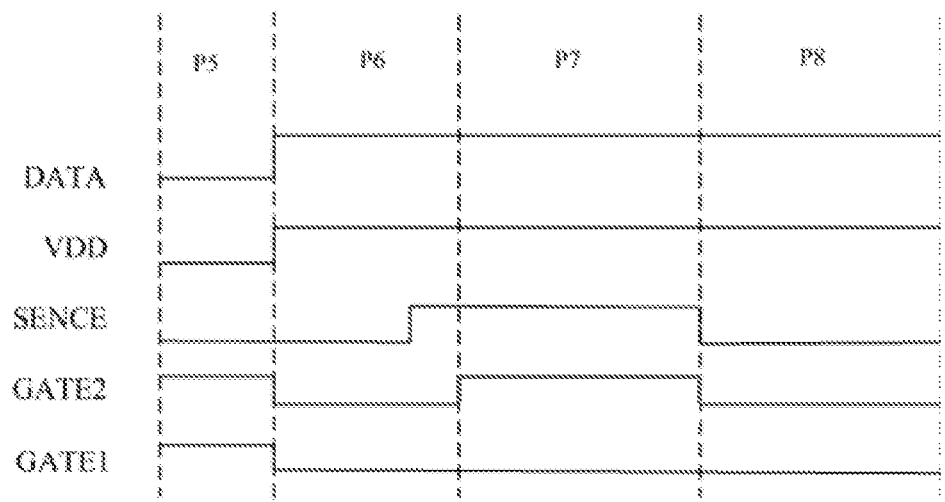
FIG. 4 is a timing diagram of a detection method for a display substrate according to another embodiment of the present disclosure.

Whether the first gate line G1 has the defect of breakpoint is detected in the above steps. Further, it is also possible to detect whether the second gate line G2 has a breakpoint. With reference to FIG. 4, the detection method includes, for example, a second reset stage P5, a second writing stage P7, and a second detection stage P8.

In the second reset stage P5, an active voltage is provided to both ends of the second gate line G2 to be detected, an active voltage is provided to both ends of the first gate line G1 corresponding to the second gate line G2 to be detected, an inactive voltage is provided to each of the data lines D, and an inactive voltage is provided to each of the sensing lines S.

Thus, the voltages at both electrodes of each storage capacitor C1 corresponding to the second gate line G2 to be detected are all reset to the inactive voltage. Taking the transistors being NMOS transistors as an example, the voltages at two electrodes of each storage capacitor C1 may be reset to the inactive voltage, i.e., a ground voltage.

In the second writing stage P7, an active voltage is provided to both ends of the second gate line G2 to be detected, an inactive voltage is provided to both ends of the first gate line G1 corresponding to the second gate line G2 to be detected, and an active voltage is provided to each of the sensing lines S, where an absolute value of the active voltage provided to each of the sensing lines S is greater than an absolute value of the active voltage provided to both ends of the second gate line G2 to be detected.

Therefore, in a case where the second gate line G2 to be detected has no breakpoint, the voltage of the drain of each sensing transistor T2 corresponding thereto is greater than the voltage of the gate thereof, and at this stage, the sensing transistors T2 are sufficiently turned on, and a high level voltage is written into the second electrode of the storage capacitor C1. While the first electrode of the storage capacitor C1 is floating and is still kept at a low level voltage.

In the second detection stage P8, an inactive voltage is provided to both ends of the second gate line G2 to be detected, an inactive voltage is provided to both ends of the first gate line G1 corresponding to the second gate line G2 to be detected, an inactive voltage is provided to each of the sensing lines S, the voltages at the pixel electrodes P corresponding to the second gate line G2 to be detected are detected, in response to that the absolute values of the voltages at the pixel electrodes P corresponding to the second gate line G2 to be detected are all greater than a second preset threshold value, it is determined that the second gate line G2 to be detected has no defect of breakpoint, and otherwise, it is determined that the second gate line G2 to be detected has a defect of breakpoint.

In this stage, the voltages at both electrodes of each storage capacitor C1 corresponding to the second gate line G2 to be detected are remained stable. In response to that the second gate line G2 to be detected has no breakpoint, a high level voltage can be written into each of the pixel electrodes P corresponding thereto. In response to that the second gate line G2 to be detected has a breakpoint, consecutive sensing transistors T2 near the breakpoint are always turned off or in a slightly turned-on state, and the voltages at the pixel electrodes P are lower than voltages expected to be written. Therefore, it can be determined that the defect of breakpoint of the second gate line G2 exists at the position where the pixel electrodes P with the lower continuous voltages are located. According to the driving sequence mentioned above, not only the defect of breakpoint of the second gate line be detected can be detected, but also the dot defect can be presented in a line defect manner.

In some implementations, after the second reset stage P5 and before the second write stage P7, a second preparation stage P6 is further included, in which an inactive voltage is provided to both ends of the second gate line G2 to be detected, an inactive voltage is provided to both ends of the first gate line G1 corresponding to the second gate line G2 to be detected, an inactive voltage is provided to each of the sensing lines S first and then an active voltage is provided to each of the sensing lines S and maintained.

That is, an active voltage is provided to the drain of each of the sensing transistors T2 corresponding to the second gate line G2 to be detected in advance.

In some implementations, in the second preparation stage P6, an active voltage is provided to each of the data lines D, and an active voltage is provided to each of the power supply terminals V1 of the pixel circuits corresponding to the second gate line G2 to be detected.

Certainly, at this stage, the switching transistors T1 and the driving transistors T0 corresponding to the second gate line G2 to be detected are all turned off, and thus the voltage provided to each of the data lines D may be an inactive voltage, and the voltage provided to each of the power supply terminals V1 of the pixel circuits corresponding to the second gate line G2 to be detected may also be an inactive voltage.

Figure 5:
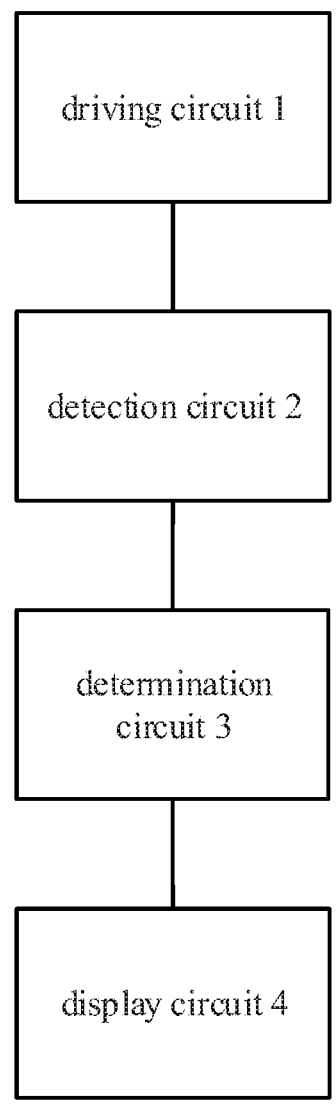
FIG. 5 is a schematic structural diagram of a detection device for a display substrate according to an embodiment of the present disclosure.

Referring to FIG. 5, an embodiment of the present disclosure provides a detection device for a display substrate, so as to implement the detection method provided in the foregoing embodiment. Referring to FIG. 1, the display substrate has a plurality of pixel circuits arranged in a first direction and a second direction which intersect each other, a plurality of first gate lines G1 extending in the first direction, and a plurality of data lines D extending in the second direction, each first gate line G1 corresponds to a same row of pixel circuits arranged in the first direction, each data line D corresponds to a same column of pixel circuits arranged in the second direction, the pixel circuit has a switching transistor T1, a driving transistor T0 and a storage capacitor C1, a gate of the switching transistor T1 is coupled to the first gate line G1 corresponding thereto, a first electrode of the switching transistor T1 is coupled to the data line D corresponding thereto, a second electrode of the switching transistor T1 is coupled to a first electrode of the storage capacitor C1 and a gate of the driving transistor T0, a first electrode of the driving transistor T0 is coupled to a power supply terminal V1, and a second electrode of the driving transistor T0 is coupled to a second electrode of the storage capacitor C1; referring to FIG. 5, the detection device includes a driving circuit 1, a detection circuit 2, and a determination circuit 3. The driving circuit 1 is configured to: in the first writing state, provide an active voltage to each of the data lines D, provide an active voltage to each power supply terminal V1, and provide an active voltage to both ends of the first gate line G1 to be detected, where an absolute value of the active voltage provided to the data line D is smaller than that of the active voltage provided to the power supply terminal V1, and an absolute value of the active voltage provided to both ends of the first gate line G1 to be detected is smaller than that of the active voltage provided to the data line D; in the first detection stage, the active voltage provided to each of the power source terminals V1 is maintained, an inactive voltage is provided to both ends of the first gate line G1 to be detected, and an active voltage is provided to each of the data lines D. The detection circuit 2 is configured to detect voltages at pixel electrodes P (i.e., the second electrode of the storage capacitor C1) corresponding to the first gate line G1 to be detected in the first detection stage; the determination circuit 3 is configured to determine that the first gate line G1 to be detected has no defect of breakpoint when absolute values of the voltages at the second electrodes of storage capacitors C1 corresponding to the first gate line G1 to be detected are all greater than a first preset threshold, and otherwise determine that the first gate line to be detected has defect of breakpoint (certainly, at this time, the absolute values of the voltages at the second electrodes of multiple consecutive storage capacitors C1 among the second electrodes of the storage capacitors C1 corresponding to the first gate line G1 to be detected are less than the first preset threshold and absolute values of the voltages at the second electrodes of the remaining storage capacitors C1 are greater than the first preset threshold, it can be further determined that the first gate line G1 to be detected has defect of breakpoint at positions corresponding to the second electrodes of the multiple consecutive storage capacitors C1).

In some implementations, the display substrate further has a plurality of second gate lines G2 extending along the first direction, a plurality of sensing lines S extending along the second direction, each second gate line G2 corresponds to a same row of pixel circuits arranged along the first direction, each sensing line S corresponds to a same column of pixel circuits arranged along the second direction, each of the pixel circuits further has a sensing transistor T2, a gate of the sensing transistor T2 is coupled to the second gate line G2 corresponding thereto, a first electrode of the sensing transistor T2 is coupled to the sensing line S corresponding thereto, and a second electrode of the sensing transistor T2 is coupled to the pixel electrode P in the pixel circuit where the sensing transistor T2 is located; the driving circuit 1 is further configured to provide an inactive voltage to both ends of the second gate line G2 corresponding to the first gate line G1 to be detected in both the first writing stage and the first detection stage.

In some implementations, the driving circuit 1 is further configured to provide an active voltage to each of the sensing lines S in both the first writing stage and the first detection stage.

In some implementations, the driving circuit 1 is further configured to: in the first reset stage before the first writing stage, provide an inactive voltage to each of the data lines D, provide an inactive voltage to each of the sensing lines S, provide an inactive voltage to each power supply terminal V1, provide an active voltage to both ends of the first gate line G1 to be detected, and provide an active voltage to both ends of the second gate line G2 corresponding to the first gate line G1 to be detected.

In some implementations, the driving circuit 1 is further configured to: in a first preparation stage before the first writing stage and after the first reset stage, provide an active voltage to each of the data lines D, provide an active voltage to each power supply terminal V1, provide an active voltage to each of the sensing lines S, provide an inactive voltage to both ends of the first gate line G1 to be detected, and provide an inactive voltage to both ends of the second gate line G2 corresponding to the first gate line G1 to be detected, where an absolute value of the active voltage provided to the data line D is smaller than an absolute value of the active voltage provided to the power supply terminal V1.

In some implementations, the driving circuit 1 is further configured to: in the second reset stage, provide an inactive voltage to both ends of the second gate line G2 to be detected, provide an active voltage to both ends of the first gate line G1 corresponding to the second gate line G2 to be detected, provide a ground voltage to each of the data lines D, and provide a ground voltage to each of the sensing lines S; in the second writing stage, provide an active voltage to both ends of the second gate line G2 to be detected, provide an inactive voltage to both ends of the first gate line G1 corresponding to the second gate line G2 to be detected, and provide an active voltage to each of the sensing lines S, where an absolute value of the active voltage provided to each of the sensing lines S is greater than an absolute value of the active voltage provided to both ends of the second gate line G2 to be detected; in the second detection stage, provide an inactive voltage to both ends of the second gate line G2 to be detected, provide an inactive voltage to both ends of the first gate line G1 corresponding to the second gate line G2 to be detected, provide an inactive voltage to each of the sensing lines S, and maintain active voltages at each of the data lines D and the power supply line; the detection circuit 2 is further configured to detect voltages at the pixel electrodes P corresponding to the second gate line G2 to be detected in the second detection stage; the determination circuit 3 is further configured to determine that the second gate line G2 to be detected has no defect of breakpoint when the absolute values of the voltages at the second electrodes of the storage capacitors C1 corresponding to the second gate line G2 to be detected are all greater than the second preset threshold, otherwise determine that the second gate line G2 to be detected has defect of breakpoint certainly, in this time, the absolute values of the voltages at the second electrodes of the consecutive storage capacitors C1 among the second electrodes of the storage capacitors C1 corresponding to the second gate line G2 to be detected are all smaller than the second preset threshold, and it can be further determined that the second gate line G2 to be detected has defect of breakpoint at positions corresponding to the consecutive pixel electrodes P with lower absolute values of voltages).

In some implementations, the driving circuit 1 is further configured to: in the second preparation stage before the second writing stage and after the second reset stage, provide an inactive voltage to both ends of the second gate line G2 to be detected, provide an inactive voltage to both ends of the first gate line G1 corresponding to the second gate line G2 to be detected, provide an inactive voltage to each of the sensing lines S first and then provide an active voltage to each of the sensing lines S and maintain the active voltage provided to each of the sensing lines S, while maintaining the active voltages provided to each of the data lines D and the power supply line.

In some implementations, the driving circuit 1 is further configured to supply an active voltage to each of the data lines D and to provide an active voltage to each power supply terminal V1 of the pixel circuits corresponding to the second gate line G2 to be detected in the second preparation stage.

In some implementations, the detection device further includes a display circuit 4, the display circuit 4 is configured to display, in a first color, the second electrodes of the storage capacitors C1 at which an absolute value of the voltage is greater than or equal to a first preset threshold value among the second electrodes of the storage capacitors C1 corresponding to the first gate line G1 to be detected, and display, in a second color, the second electrodes of the storage capacitors C1 at which an absolute value of the voltage is less than the first preset threshold value among the second electrodes of the storage capacitors C1 corresponding to the first gate line G1 to be detected, where the first color is different from the second color.

In some implementations, the display circuit 4 may be further configured to display, in a third color, the second electrodes of the storage capacitors C1 each at which an absolute value of the voltage is greater than the second preset threshold value among the second electrode of the storage capacitors C1 corresponding to the second gate line G2 to be detected, and display, in a fourth color, the second electrodes of the storage capacitors C1 at which an absolute value of the voltage is less than the second preset threshold value among the second electrodes of the storage capacitors C1 corresponding to the second gate line G2 to be detected, where the third color is different from the fourth color.

Therefore, the position where the defect of breakpoint occurs can be conveniently and visually displayed for a user.

In some implementations, the transistors are N-type transistors, the active voltage is a high level voltage, and the inactive voltage is a low level voltage.

Certainly, in order to implement the detection method provided in the foregoing embodiment, the detection device may directly generate a determination result indicating whether the breakpoint exists, without performing graphical display.

It will be understood that the above embodiments are merely exemplary embodiments adopted to illustrate the principles of the present disclosure, and the present disclosure is not limited thereto. It will be apparent to those skilled in the art that various modifications and variants can be made without departing from the spirit and scope of the present disclosure, and such modifications and variants are considered to be within the scope of the present disclosure.

What is claimed is:

1. A detection method for a display substrate, the display substrate comprises a plurality of pixel circuits arranged along a first direction and a second direction which intersect with each other, a plurality of first gate lines extending along the first direction, and a plurality of data lines extending along the second direction, wherein a same row of pixel circuits arranged along the first direction correspond to one of the first gate line, a same column of pixel circuits arranged along the second direction correspond to one of the data lines, each of the pixel circuits comprises a switching transistor, a driving transistor and a storage capacitor, wherein a gate of the switching transistor is coupled with the first gate line corresponding thereto, a first electrode of the switching transistor is coupled with the data line corresponding thereto, a second electrode of the switching transistor is coupled with a first electrode of the storage capacitor and a gate of the driving transistor, a first electrode of the driving transistor is coupled with a power supply terminal, and a second electrode of the driving transistor is coupled with a second electrode of the storage capacitor; wherein the detection method comprises a first writing stage and a first detection stage, and wherein, in the first writing stage, providing an active voltage to each of the data lines, providing an active voltage to each power supply terminal, and providing an active voltage to both ends of the first gate line to be detected, wherein an absolute value of the active voltage provided to each of the data lines is smaller than that of the active voltage provided to the power supply terminal, and an absolute value of the active voltage provided to the both ends of the first gate line to be detected is smaller than that of the active voltage provided to each of the data lines;

in the first detection stage, maintaining the active voltage provided to the power supply terminal unchanged, providing an inactive voltage to both ends of the first gate line to be detected and providing an active voltage to each of the data lines, detecting voltages at second electrodes of storage capacitors corresponding to the first gate line to be detected, and determining whether the first gate line to be detected has defect of breakpoint according to the detected voltages;

in response to that the absolute value of the voltage at the second electrode of each storage capacitor corresponding to the first gate line to be detected is larger than a first preset threshold, determining that the first gate line to be detected has no defect of breakpoint; otherwise, determining that first gate line to be detected has defect of breakpoint.

2. The detection method of claim 1, wherein the display substrate further comprises a plurality of second gate lines extending along the first direction, and a plurality of sensing lines extending along the second direction, a same row of pixel circuits arranged along the first direction correspond to one of the second gate lines, a same column of pixel circuits arranged along the second direction correspond to one of the sensing lines, the pixel circuit further comprises a sensing transistor, a gate of the sensing transistor is coupled with the second gate line corresponding thereto, a first electrode of the sensing transistor is coupled with the sensing line corresponding thereto, and a second electrode of the sensing transistor is coupled with the second electrode of the storage capacitor corresponding thereto;

in the first writing stage and the first detection stage, an inactive voltage is provided to both ends of the second gate line corresponding to the first gate line to be detected, and an active voltage is provided to each of the sensing lines.

3. The detection method of claim 2, further comprising a first reset stage before the first writing stage, wherein in the first reset stage, providing an inactive voltage to each of the data lines, providing an inactive voltage to each of the sensing lines, providing an inactive voltage to each power supply terminal, providing an active voltage to both ends of the first gate line to be detected, and providing an active voltage to both ends of the second gate line corresponding to the first gate line to be detected.

4. The detection method of claim 3, further comprising a first preparation stage before the first writing stage and after the first reset stage, wherein in the first preparation stage, providing an active voltage to each of the data lines, providing an active voltage to each power supply terminal, providing an active voltage to each of the sensing lines, providing an inactive voltage to both ends of the first gate line to be detected, and providing an inactive voltage to both ends of the second gate line corresponding to the first gate line to be detected, wherein an absolute value of the active voltage provided to each of the data lines is smaller than an absolute value of the active voltage provided to each power supply terminal.

5. The detection method of claim 2, further comprising a second reset stage, a second writing stage and a second detection stage, wherein in the second reset stage, providing an active voltage to both ends of the second gate line to be detected, providing an active voltage to both ends of the first gate line corresponding to the second gate line to be detected, providing an inactive voltage to each of the data lines, and providing an inactive voltage to each of the sensing lines;

in the second writing stage, providing an active voltage to both ends of the second gate line to be detected, providing an inactive voltage to both ends of the first gate line corresponding to the second gate line to be detected, providing an active voltage to each of the sensing lines, providing an active voltage to each of the data lines D, and providing an active voltage to each power supply terminal, wherein an absolute value of the active voltage provided to each of the sensing lines is greater than an absolute value of the active voltage provided to the both ends of the second gate line to be detected;

in the second detection stage, providing an inactive voltage to both ends of the second gate line to be detected, providing an inactive voltage to both ends of the first gate line corresponding to the second gate line to be detected, providing an inactive voltage to each of the sensing lines, detecting voltages at second electrodes of storage capacitors corresponding to the second gate line to be detected, and determining whether the second gate line to be detected has defect of breakpoint according to the detected voltages;

in response to that the absolute values of the voltages at the second electrodes of the storage capacitors corresponding to the second gate line to be detected are all larger than a second preset threshold value, determining that the second gate line to be detected has no defect of breakpoint; otherwise, determining that the second gate line to be detected has defect of breakpoint.

6. The detection method of claim 3, further comprising a second reset stage, a second writing stage and a second detection stage, wherein in the second reset stage, providing an active voltage to both ends of the second gate line to be detected, providing an active voltage to both ends of the first gate line corresponding to the second gate line to be detected, providing an inactive voltage to each of the data lines, and providing an inactive voltage to each of the sensing lines;

in the second writing stage, providing an active voltage to both ends of the second gate line to be detected, providing an inactive voltage to both ends of the first gate line corresponding to the second gate line to be detected, providing an active voltage to each of the sensing lines, providing an active voltage to each of the data lines D, and providing an active voltage to each power supply terminal, wherein an absolute value of the active voltage provided to each of the sensing lines is greater than an absolute value of the active voltage provided to the both ends of the second gate line to be detected;

in the second detection stage, providing an inactive voltage to both ends of the second gate line to be detected, providing an inactive voltages to both ends of the first gate line corresponding to the second gate line to be detected, providing an inactive voltage to each of the sensing lines, detecting voltages at second electrodes of storage capacitors corresponding to the second gate line to be detected, and determining whether the second gate line to be detected has defect of breakpoint according to the detected voltages;

in response to that the absolute values of the voltages at the second electrodes of the storage capacitors corresponding to the second gate line to be detected are all larger than a second preset threshold value, determining that the second gate line to be detected has no defect of breakpoint; otherwise, determining that the second gate line to be detected has defect of breakpoint.

7. The detection method of claim 4, further comprising a second reset stage, a second writing stage and a second detection stage, wherein in the second reset stage, providing an active voltage to both ends of the second gate line to be detected, providing an active voltage to both ends of the first gate line corresponding to the second gate line to be detected, providing an inactive voltage to each of the data lines, and providing an inactive voltage to each of the sensing lines;

in the second writing stage, providing an active voltage to both ends of the second gate line to be detected, providing an inactive voltage to both ends of the first gate line corresponding to the second gate line to be detected, providing an active voltage to each of the sensing lines, providing an active voltage to each of the data lines D, and providing an active voltage to each power supply terminal, wherein an absolute value of the active voltage provided to each of the sensing lines is greater than an absolute value of the active voltage provided to the both ends of the second gate line to be detected;

in the second detection stage, providing an inactive voltage to both ends of the second gate line to be detected, providing an inactive voltages to both ends of the first gate line corresponding to the second gate line to be detected, providing an inactive voltage to each of the sensing lines, detecting voltages at second electrodes of storage capacitors corresponding to the second gate line to be detected, and determining whether the second gate line to be detected has defect of breakpoint according to the detected voltages;

in response to that the absolute values of the voltages at the second electrodes of the storage capacitors corresponding to the second gate line to be detected are all larger than a second preset threshold value, determining that the second gate line to be detected has no defect of breakpoint; otherwise, determining that the second gate line to be detected has defect of breakpoint.

8. The detection method of claim 5, further comprising a second preparation stage before the second writing stage and after the second reset stage, wherein in the second preparation stage, providing an inactive voltage to both ends of the second gate line to be detected, providing an inactive voltage to both ends of the first gate line corresponding to the second gate line to be detected, providing an inactive voltage to each of the sensing lines firstly, then providing an active voltage to each of the sensing lines and maintaining the active voltage provided to each of the sensing lines, and meanwhile, maintaining the active voltages of each of the data lines and each power supply terminal.

9. The detection method of claim 6, further comprising a second preparation stage before the second writing stage and after the second reset stage, wherein in the second preparation stage, providing an inactive voltage to both ends of the second gate line to be detected, providing an inactive voltage to both ends of the first gate line corresponding to the second gate line to be detected, providing an inactive voltage to each of the sensing lines firstly, then providing an active voltage to each of the sensing lines and maintaining the active voltage provided to each of the sensing lines, and meanwhile, maintaining the active voltages of each of the data lines D and each power supply terminal.

10. The detection method of claim 7, further comprising a second preparation stage before the second writing stage and after the second reset stage, wherein in the second preparation stage, providing an inactive voltage to both ends of the second gate line to be detected, providing an inactive voltage to both ends of the first gate line corresponding to the second gate line to be detected, providing an inactive voltage to each of the sensing lines firstly, then providing an active voltage to each of the sensing lines and maintaining the active voltage provided to each of the sensing lines, and meanwhile, maintaining the active voltages of each of the data lines D and each power supply terminal.

11. A detection device for a display substrate, the display substrate comprises a plurality of pixel circuits arranged along a first direction and a second direction which intersect with each other, a plurality of first gate lines extending along the first direction, and a plurality of data lines extending along the second direction, a same row of pixel circuits arranged along the first direction correspond to one of the first gate lines, a same column of pixel circuits arranged along the second direction correspond to one of the data lines, the pixel circuit comprises a switching transistor, a driving transistor and a storage capacitor, a gate of the switching transistor is coupled with the first gate line corresponding thereto, a first electrode of the switching transistor is coupled with the data line corresponding thereto, a second electrode of the switching transistor is coupled with a first electrode of the storage capacitor and a gate electrode of the driving transistor, a first electrode of the driving transistor is coupled with a power supply terminal, and a second electrode of the driving transistor is coupled with a second electrode of the storage capacitor; wherein the detection device comprises a driving circuit, a detection circuit and a determination circuit, the driving circuit is configured to: in a first writing stage, provide an active voltage to each of the data lines, provide an active voltage to the power supply terminal, and provide an active voltage to both ends of the first gate line to be detected, wherein an absolute value of the active voltage provided to each of the data lines is smaller than that of the active voltage provided to the power supply terminal, and an absolute value of the active voltage provided to both ends of the first gate line to be detected is smaller than that of the active voltage provided to each of the data lines; in the first detection stage, maintain the active voltage provided to the power supply terminal unchanged, provide an inactive voltage to both ends of the first gate line to be detected and provide an active voltage to each of the data lines;

the detection circuit is configured to: detect voltages at second electrodes of storage capacitors corresponding to the first gate line to be detected in the first detection stage;

the determination circuit is configured to: determine whether the first gate line to be detected has defect of breakpoint or not according to the voltages detected by the detection circuit;

in response to that the absolute values of the voltages at the second electrode of the storage capacitors corresponding to the first gate line to be detected are all larger than a first preset threshold, the determination circuit determines that the first gate line to be detected has no defect of breakpoint; otherwise, the determination circuit determines that the first gate line to be detected has defect of breakpoint.

12. The detection device of claim 11, wherein the display substrate further comprises a plurality of second gate lines extending along the first direction, and a plurality of sensing lines extending along the second direction, wherein a one of the second gate lines, a same column of pixel circuits arranged along the second direction correspond to one of the sensing lines, the pixel circuit further comprises a sensing transistor, a gate of the sensing transistor is coupled to a second gate line corresponding thereto, a first electrode of the sensing transistor is coupled to the sensing line corresponding thereto, and a second electrode of the sensing transistor is coupled to the second electrode of the storage capacitor in the pixel circuit where the sensing transistor is located;

the driving circuit is further configured to: in the first writing stage and the first detection stage, provide an inactive voltage to both ends of the second gate line corresponding to the first gate line to be detected, and provide an active voltage to each of the sensing lines.

13. The detection device of claim 12, wherein the driving circuit is further configured to: in a first reset stage before the first writing stage, providing an inactive voltage to each of the data lines, provide an inactive voltage to each of the sensing lines, provide an inactive voltage to each power supply terminal, provide an active voltage to both ends of the first gate line to be detected, and provide an active voltage to both ends of the second gate line corresponding to the first gate line to be detected.

14. The detection device of claim 13, wherein the driving circuit is further configured to: in a first preparation stage before the first writing stage and after the first reset stage, provide an active voltage to each of the data lines, provide an active voltage to each power supply terminal, provide an active voltage to each of the sensing lines, provide an inactive voltage to both ends of the first gate line to be detected, and provide an inactive voltage to both ends of the second gate line corresponding to the first gate line to be detected, wherein an absolute value of the active voltage provided to each of the data lines is smaller than an absolute value of the active voltage provided to the power supply terminal.

15. The detection device of claim 12, wherein the driving circuit is further configured to: in a second reset stage, provide an active voltage to both ends of the second gate line to be detected, provide an active voltage to both ends of the first gate line corresponding to the second gate line to be detected, provide an inactive voltage to each of the data lines, and provide an inactive voltage to each of the sensing lines; in a second writing stage, provide an active voltage to both ends of the second gate line to be detected, provide an inactive voltage to both ends of the first gate line corresponding to the second gate line to be detected, provide an active voltage to each of the sensing lines, provide an active voltage to each of the data lines, and provide an active voltage to each power supply terminal, wherein an absolute value of the active voltage provided to each of the sensing lines is greater than an absolute value of the active voltage provided to the both ends of the second gate line to be detected; in a second detection stage, provide an inactive voltage to both ends of the second gate line to be detected, provide an inactive voltage to both ends of the first gate line corresponding to the second gate line to be detected, provide an inactive voltage to each of the sensing lines, and simultaneously maintain inactive voltages of each of the data lines and the power supply line;

the detection circuit is further configured to: detect the voltages at the second electrodes of the storage capacitors corresponding to the second gate line to be detected in the second detection stage;

the determination circuit is further configured to determine whether the second gate line to be detected has defect of breakpoint according to the voltages detected by the detection circuit;

in response to that the absolute values of the voltages at the second electrodes of the storage capacitors corresponding to the second gate line to be detected are all larger than a second preset threshold value, the determination circuit determinates that the second gate line to be detected has no defect of breakpoint; otherwise, the determination circuit determines that the second gate line to be detected has defect of breakpoint.

16. The detection device of claim 15, wherein the driving circuit is further configured to: in a second preparation stage before the second writing stage and after the second reset stage, provide an inactive voltage to both ends of the second gate line to be detected, provide an inactive voltage to both ends of the first gate line corresponding to the second gate line to be detected, provide an inactive voltage to each of the sensing lines first and then provide an active voltage to each of the sensing lines, while maintaining active voltages of each of the data lines and the power supply line.

17. The detection device of claim 11, further comprising a display circuit, wherein the display circuit is configured to display, in a first color, the second electrode of the storage capacitor at which an absolute value of the voltage is greater than or equal to the first preset threshold value among the second electrodes of the storage capacitors corresponding to the first gate line to be detected, and to display, in a second color, the second electrode of the storage capacitor at which the an absolute value of the voltage is less than the first preset threshold value among the second electrodes of the storage capacitors corresponding to the first gate line to be detected, and the first color is different from the second color.

18. The detection device of claim 12, further comprising a display circuit, wherein the display circuit is configured to display, in a first color, the second electrode of the storage capacitor at which an absolute value of the is greater than or equal to the first preset threshold value among the second electrodes of the storage capacitors corresponding to the first gate line to be detected, and to display, in a second color, the second electrode of the storage capacitor at which an absolute value of the voltage is less than the first preset threshold value among the second electrodes of the storage capacitors corresponding to the first gate line to be detected, and the first color is different from the second color.

19. The detection device of claim 15, further comprising a display circuit configured to display, in a third color, the second electrode of the storage capacitor at which an absolute value of the voltage is larger than the second preset threshold value among the second electrodes of the storage capacitors corresponding to the second gate line to be detected, and display, in a fourth color, the second electrode of the storage capacitor at which an absolute value of the voltage is smaller than the second preset threshold value among the second electrodes of the storage capacitors corresponding to the second gate line to be detected, wherein the third color is different from the fourth color.

20. The detection device of claim 16, further comprising a display circuit configured to display, in a third color, the second electrode of the storage capacitor at which an absolute value of the voltage is larger than the second preset threshold value among the second electrodes of the storage capacitors corresponding to the second gate line to be detected, and display, in a fourth color, the second electrode of the storage capacitor at which an absolute value of the voltage is smaller than the second preset threshold value among the second electrodes of the storage capacitors corresponding to the second gate line to be detected, wherein the third color is different from the fourth color.

* * * * *